US006790685B2

(12) United States Patent
Lee

(10) Patent No.: US 6,790,685 B2
(45) Date of Patent: Sep. 14, 2004

(54) METHOD OF FORMING A TEST PATTERN, METHOD OF MEASURING AN ETCHING CHARACTERISTIC USING THE SAME AND A CIRCUIT FOR MEASURING THE ETCHING CHARACTERISTIC

(75) Inventor: Ga Won Lee, Kyungki-do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/137,067

(22) Filed: May 2, 2002

(65) Prior Publication Data

US 2003/0100132 A1 May 29, 2003

(30) Foreign Application Priority Data

Nov. 23, 2001 (KR) .......................................... 2001-73417

(51) Int. Cl.[7] .............................................. H01L 21/66
(52) U.S. Cl. .............................. 438/14; 438/11; 438/18
(58) Field of Search .............................. 438/14, 10, 11, 438/17, 18, 934

(56) References Cited

U.S. PATENT DOCUMENTS 4,956,611 A * 9/1990 Maltiel ........................ 324/699
5,627,101 A * 5/1997 Lin et al. ........................ 438/18
5,963,784 A * 10/1999 Bothra et al. .................. 438/18
6,057,171 A * 5/2000 Chou et al. .................... 438/15
6,087,189 A * 7/2000 Huang ........................... 438/10
6,559,475 B1 * 5/2003 Kim ............................... 257/48

* cited by examiner

*Primary Examiner*—Kevin M. Picardat
(74) *Attorney, Agent, or Firm*—Marshall, Gerstein & Borun LLP

(57) ABSTRACT

A method of forming a test pattern includes: forming first and second junction regions having a symmetrical structure on both side of field oxide layer formed on a semiconductor substrate; forming third and fourth junction regions having a asymmetrical structure on front and rear portions of the field oxide layer; forming a test pattern having first and second projection portions on the semiconductor substrate, in which both side portions of the test pattern are overlapped with the first and second junction regions and the first and second projection portions which are formed on front and rear portions of the test pattern are overlapped with the third and fourth junction regions; forming an inter insulating layer on a resulting structure after forming the test pattern; patterning the inter insulating layer to expose a portion of the first to fourth junction regions; forming current supply lines connected to the first and second junction regions, respectively; and forming voltage measuring lines connected to the third and fourth junction regions, respectively.

10 Claims, 6 Drawing Sheets

METHOD OF FORMING A TEST PATTERN, METHOD OF MEASURING AN ETCHING CHARACTERISTIC USING THE SAME AND A CIRCUIT FOR MEASURING THE ETCHING CHARACTERISTIC

BACKGROUND

1. Technical Field

A method of forming a test pattern in a semiconductor device is disclosed, and, more specifically a method of forming a test pattern in a semiconductor device which can identify overetch and underetch that occur side walls of a pattern after an etching process is disclosed.

2. Description of the Related Art

In general, overetch or underetch may occurs at side walls of a gate electrode during the formation of the gate electrode through an etching process. Due to the overetch or underetch, channel length or channel width is changed, thereby deteriorating the electric characteristic of a semiconductor device. It is therefore desirable to measuring variation of the electric characteristic by monitoring an etching profile of the side walls of the gate electrode after the formation of the gate electrode. In a polysilicon and metal stacked gate structure that has being broadly used in logic and DRAM devices, it is difficult to monitor an etching profile of side walls of an under polysilicon gate which affects electric characteristic of the device.

FIG. 1 illustrates a sectional view for explaining structure of a transistor. A transistor having a gate, a source and a drain is formed on a semiconductor substrate, in which a field oxide film 12 and a well 13 are formed. The gate having a gate oxide film 14, a polysilicon film 15, a barrier metal film 16 and a metal film 17, which are sequentially stacked, is formed on the well 13 and a spacer 18 is then formed on side walls of the gate. A source and a drain are formed in the semiconductor substrate 11 by means of an impurity ion implant process.

During an etching process for the gate after sequentially forming the gate oxide film 14, the polysilicon film 15, the barrier metal film 16 and the metal film 17, overetch or underetch may be occurred the side wall A of the polysilicon film 15. As shown in FIG. 1, due to the occurrence of the overetch or the underetch in the side wall A of the polysilicon film 15, a channel length is changed and thereby deteriorating electric characteristic.

As a matter of fact, FIG. 1 illustrates a typical sectional view of a transistor having a metal and polysilicon stacked gate structure and illustrates an enlarged sectional view of "A" portion. In a metal and polysilicon stacked gate structure, the polysilicon film may be over etched due to the difference of etching selectivity between the metal, for example tungsten, and the polysilicon film, as shown in FIG. 1. It is impossible to monitor such an overetch by a conventional SEM equipment for In-line monitor. Such an overetch can be monitored by using a TEM photograph. However, it is difficult to monitor the overetch or under etch in all patterning process of a wafer.

SUMMARY OF THE DISCLOSURE

Therefore, methods of forming a test pattern in a semiconductor device are disclosed which solve the above problems.

A desired pattern is formed by means of a semiconductor process including an etching process and a current is then applied to the pattern. Voltage between first and second portions of the pattern is measured to obtain resistance and a cross sectional area of the pattern is calculated by using the resistance. That is, an etching profile of the under layer to which an etching process is performed is nondestructively and electrically measured with using the conventional MOSFET pattern as it is. It is possible to quantitatively analysis fluctuation of transistor characteristic, which is directly related to yield, due to change of a gate pattern.

A method of forming a test pattern according to the disclosure comprises:

forming first and second junction regions having a symmetrical structure on both side of field oxide layer formed on a semiconductor substrate;

forming third and fourth junction regions having a asymmetrical structure on front and rear portions of said field oxide layer;

forming a test pattern having first and second projection portions on said semiconductor substrate, in which both side portions of said test pattern are overlapped with said first and second junction regions and said first and second projection portions which are formed on front and rear portions of said test pattern are overlapped with said third and fourth junction regions;

forming an inter insulating layer on a resulting structure after forming said test pattern;

patterning said inter insulating layer to expose a portion of said first to fourth junction regions;

forming current supply lines connected to said first and second junction regions, respectively; and forming voltage measuring lines connected to said third and fourth junction regions, respectively.

The test pattern is a stack structure having a polysilicon layer, an insulating layer and a metal layer and the polysilicon layer is formed by a process of forming a polysilicon layer for a gate of a transistor which is formed on a peripheral region of said semiconductor substrate.

Another method of forming a test pattern comprises:

defining an active region by forming a field oxide layer on a semiconductor;

forming a test pattern having projection regions on said semiconductor substrate to vertically cross with said active region, in which said projection regions are formed to cross from each other in center of said active region and said is not overlapped with said active region;

performing a thermal treatment after implanting an impurity ion to an exposed portion of said active region so that first and second impurity regions are formed, wherein first and second impurity regions are overlapped with both side portions of a conductive layer;

forming an inter insulating layer on a resulting structure after forming said first and second impurity regions;

patterning said inter insulating layer to expose both edges of said active region and a portion of said projection portions;

forming current supply lines connected to said edge portions of said active region, respectively; and forming voltage measuring lines connected to said projection portions, respectively.

The step of forming a gate oxide layer may be performed after forming said field oxide layer.

The projection portion is narrower than a portion overlapped with said active region and have a "¬" or "L" shape.

A method of measuring etching characteristic using a test pattern comprises:

supplying a current to said test pattern having first and second regions;

measuring voltage between said first and second regions; and calculating a cross sectional area by resistance obtained by using said current and the measured voltage so that the etching characteristic of said test pattern is measured.

Another method of measuring etching characteristic using a test pattern comprises:

providing a test pattern formed by the method of the first embodiment;

supplying a current through said current supplying lines;

measuring voltage between said first and second region through said voltage measuring lines connected to said first and third projection portions; and calculating a cross sectional area by resistance obtained by using said current and the measured voltage so that the etching characteristic of said test pattern is measured.

Another method of measuring etching characteristic using a test pattern comprises:

providing a test pattern formed by the method of the second embodiment;

supplying a current through said current supplying lines;

measuring voltage between said projection portions of said test pattern through said voltage measuring lines connected to said projection portions; and calculating a cross sectional area by resistance obtained by using said current and the measured voltage so that the etching characteristic of said test pattern is measured.

Another method of measuring etching characteristic using a test pattern comprises:

providing a test pattern formed by the method of the second embodiment;

supplying a voltage through said voltage measuring lines to form a channel in said active region under said test pattern;

supplying a voltage to said first impurity region so that current flows from said first impurity region to said second impurity region; and measuring width of said channel through said so that the etching characteristic of said test pattern is measured.

A circuit for measuring an etching characteristic using a test pattern comprises:

a test pattern array having a plurality of test patterns formed by the method of the first or second embodiment, a plurality of current supply lines disposed in rows and a plurality of voltage measuring lines disposed in columns;

a first selecting means for selecting the voltage measuring lines;

a second selecting means for selecting the current supply lines;

current supply means for supplying a current to a current supply line connected to a test pattern selected by said first and second selecting means;

voltage detector for detecting voltage from a voltage measuring line connected to the selected pattern; and operation unit for calculating a cross sectional area by comparing a sheet resistance of said test pattern with resistance obtained by using said current and the measured voltage so that the etching characteristic of said test pattern is measured.

The operational unit comprises an A/D converter for converting an output signal from said voltage detector to a digital signal and a register for storing said digital signal.

BRIEF DESCRIPTION OF THE DRAWINGS

The aforementioned aspects and other features of the disclosed methods and circuits will be explained in the following description, taken in conjunction with the accompanying drawings, wherein.

DETAILED DESCRIPTION OF THE PRESENTLY PREFERRED EMBODIMENTS

Figure 1:
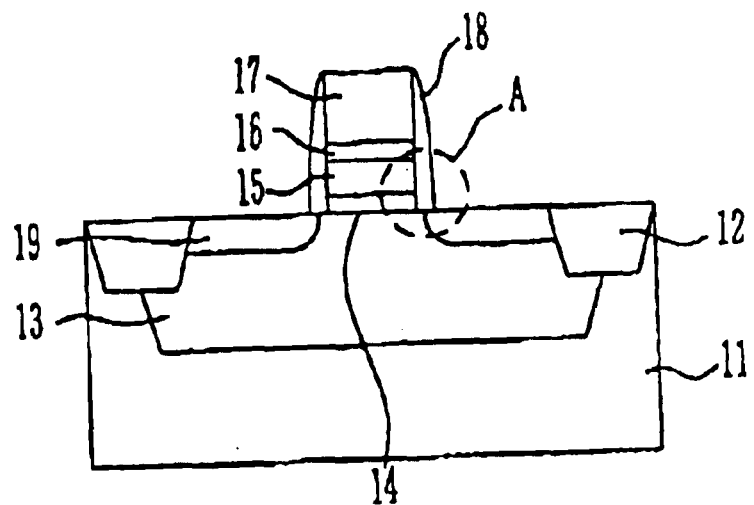
FIG. 1 is a cross sectional view explaining the structure of a conventional transistor.

The disclosed methods and circuits will be described in detail by way of preferred embodiments with reference to accompanying drawings, in which like reference numerals are used to identify the same or similar parts.

Figure 2:
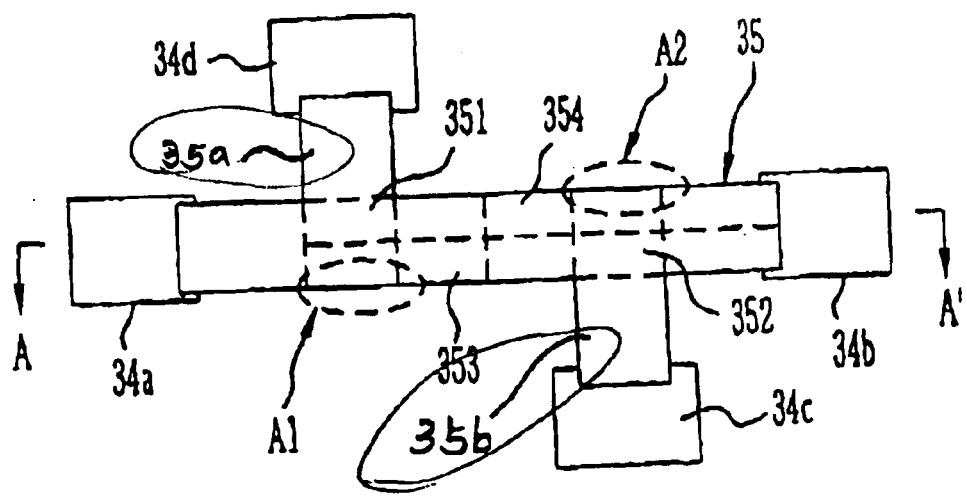
FIG. 2 is a schematic illustration of a disclosed test pattern.
Figure 3A:
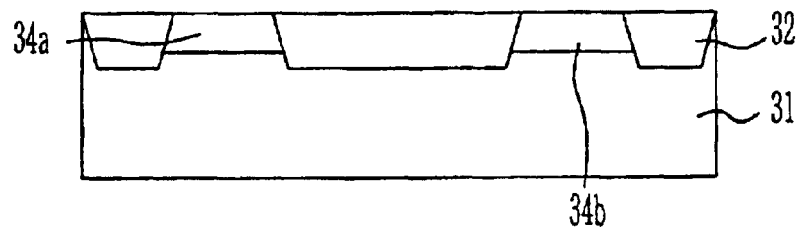
FIGS. 3a through 3c are cross sectional views for explaining a disclosed method of forming a test pattern.
Figure 3B:
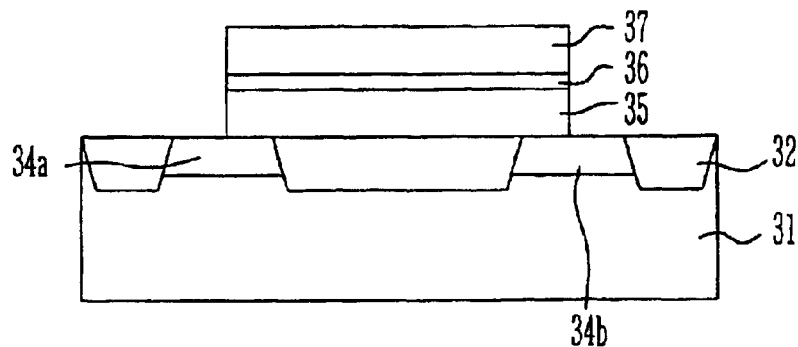
Figure 3C:
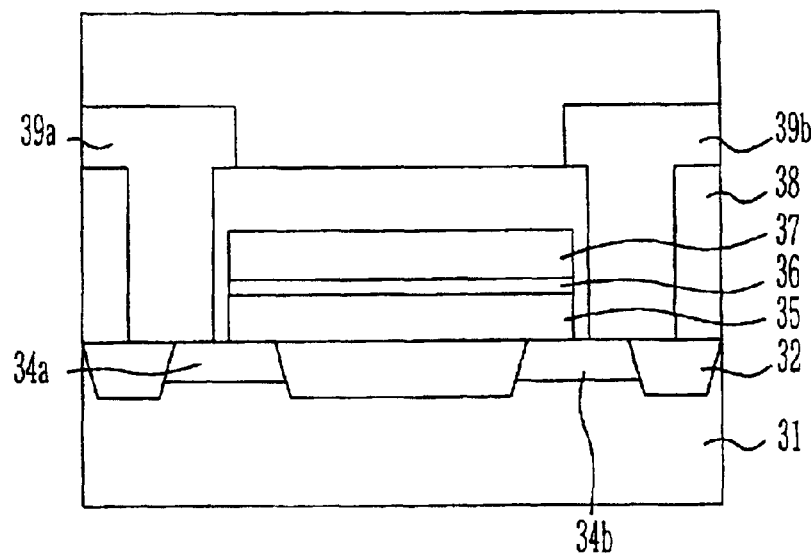

FIG. 2 is a schematic illustration for illustrating a test pattern according to the present invention. FIGS. 3a through 3c are cross sectional views taken along with line A–A' of FIG. 2 for explaining a method of forming a test pattern according to the present invention.

With reference to FIGS. 2 and 3a, first to fourth junction regions 34a to 34d are formed by means of a impurity ion implantation process in a semiconductor substrate 31 in which a field oxide film 32 is formed. The field oxide film 32 is formed by means of a LOCOS process or an STI process.

With reference to FIGS. 2 and 3a, a polysilicon layer 35, an insulating layer 36 and a metal layer 37 are sequentially formed on the entire structure. The insulating layer 36 is formed with CVD $SiO_2$.

The metal layer 37, the insulating layer 36 and the polysilicon layer 35 is patterned by means of an etching process so that both side ends of the metal layer 37, the insulating layer 36 and the polysilicon layer 35 are overlapped with a portion of the first and second junction regions 34a and 34b, first and second regions 351 and 352 of the metal layer 37, the insulating layer 36 and the polysilicon layer 35 are projected and are overlapped with a portion of the third and firth junction regions 34c and 34d.

Accordingly, the first and second junction regions 34a and 34b are electrically connected to both side ends of the polysilicon layer 35 while the third and fourth junction regions 34c and 34d is electrically connected to projected portions 35a and 35b of the first and second regions 351 and 352 in the polysilicon layer 35.

Since the polysilicon layer 35, the insulating layer 36 and the metal layer 37 are patterned by an etching process using the same mask, the metal layer 37 is also patterned to overlap with the first and fourth junction regions 34a to 34d but is electrically separated from the third and four junction regions 34c and 34d.

During the process of patterning the polysilicon layer 35, the insulating layer 36 and the metal layer 37, overetch or underetch will be occurred side walls of first and third regions 353 and 354 in the polysilicon layer 35, while overetch or underetch in the first and third regions 351 and 354 will be occurred only side walls of the dotted circle (A1 and A2).

With reference to FIGS. 2 and 3a, an insulating layer 38 is formed on the entire structure and a portion of the insulating layer 38 is removed to expose the first to the fourth junction regions 34a to 34d, thereby forming a contact hole. A conductive layer is formed on the entire structure to fill the contact hole. By means of a patterning process, first and second current supplying lines 39a and 39b are formed on the first and second junction regions to flow current into or from the polysilicon layer 35, while first and second voltage measuring lines (not shown) are formed on the third and fourth junction region 34c and 34d to measure voltage between any two points of the polysilicon layers 35, thereby forming a test pattern.

A gate of a transistor disposed near to the test pattern is formed of a stacked structure having a polysilicon layer, barrier metal layer and a metal layer. If structure of the test pattern is identical to that of the gate, a few of current is flowed into the polysilicon layer since resistance of the metal layer is smaller than that of the polysilicon layer and whole current is flowed into the metal layer.

As a result, an insulating layer 36 is formed, instead of the barrier metal layer, on a portion where the test pattern is formed so that the polysilicon layer 35 is electrically insulated from the metal layer 37 so that a current flowing into the metal layer 37 is prevented. Therefore, current flows into the polysilicon layer 35 and it is possible to measure voltage occurred in the polysilicon layer 35. It is desirable that the insulating layer 36 is formed with a desired thickness to prevent the current flowing into the metal layer 37 and not to affect a profile during etching of the gate. If the insulating layer 36 is formed of $SiO_2$, it is desirable to form with thickness of 30 Å. Here, a gate insulating process is not performed to form an ohmic contact between N+ silicon active region formed by the previous process and polysilicon.

In the above process, referring now to FIGS. 2 and 3a, an active region is defined by a filed oxide film 32 and an impurity ion implantation process is then performed to form the first through fourth junction regions 34a to 34d. It is possible that the active region is defined by the field oxide film 32 and the first to fourth junction regions 34a to 34d are then formed by implanting an impurity into the active region exposed by patterning the polysilicon layer 35, the insulating layer 36 and the metal layer 37 in FIG. 3. In this case, the first and fourth junction regions 34a to 34d may be simultaneously formed during an ion implantation process to form a source and a drain of a transistor that is formed on a peripheral region. Therefore, the impurity ion implantation process may be performed after performing a gate etching process considering simplicity of the entire process. Since the impurity is lateral diffused during a thermal process, the ohmic contact between the polysilicon layer, which is formed by a subsequent process, and the active region is easily formed.

In the process shown in FIG. 3b, the formation of the metal layer 37 and the insulating layer 36 may be omitted.

In this case, since the impurity ion implantation process to form the junction regions may be performed after the patterning process, the junction regions may be simultaneously formed during the impurity ion implantation process to form the source and the drain for a transistor in peripheral region. During the impurity ion implantation process, the impurity is simultaneously implanted to the polysilicon layer to improve electric characteristic thereof, thereby simplifying the process and becoming better compatibility with CMOS process. This can be applied to a case of simultaneously forming a $N^+$ polysilicon layer and a $P^+$ polysilicon layer.

The technical principal of the test pattern formed by the above process will be explained as follows.

Current flows through first and second current lines 39a and 39b connected to the first and second junction regions 34a and 34b. Voltage drop is occurred across the polysilicon layer 35 due to a specific resistance thereof.

Voltage between the first and second regions is measured through the first and second voltage measuring lines 34c and 34d connected to the first and second projection region which are formed the first and second region of the polysilicon layer 35. Resistance between the first and second portions is calculated by substituting the current supplied through the current line 34a and 34b, and the measured voltage for Ohm's law.

The polysilicon layer has a resistance that varies depend on a cross sectional area. As a result, the cross sectional area of the polysilicon layer is calculated by using the resistance between the first and second portions of the polysilicon layer, and thereby identifying etching rate of the polysilicon layer.

Figure 4:
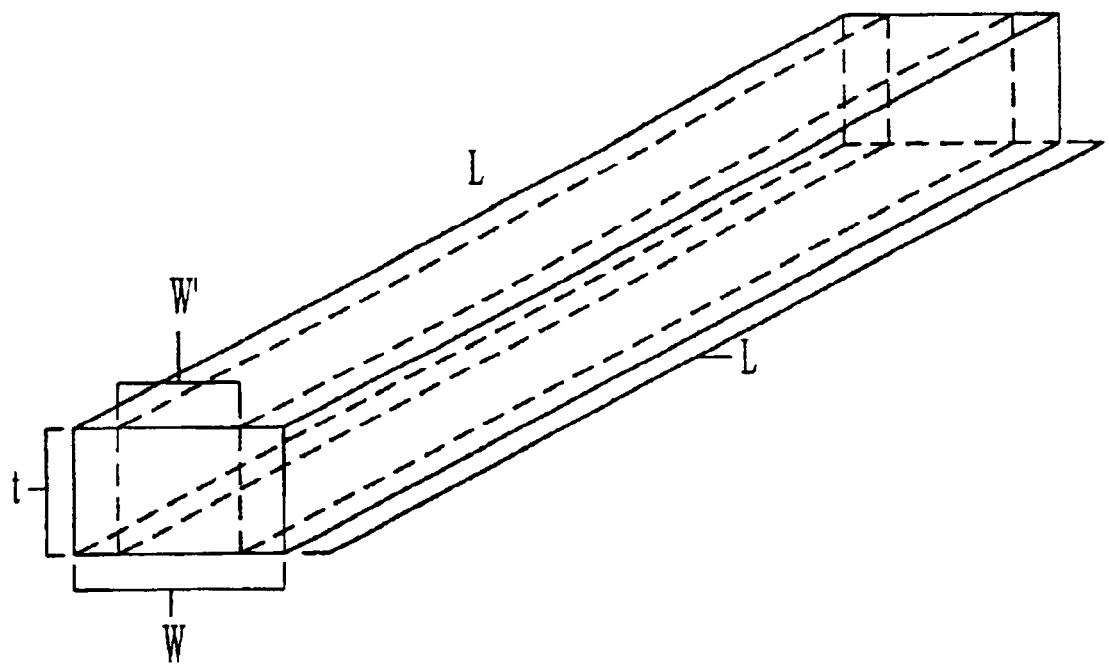
FIG. 4 is a perspective view illustrating variation of resistance according to length and width of a resistor.

Referring to FIG. 4, resistance of a conductive material is determined by a specific resistance ρ, length L, width W and thickness t as the following Equation 1.

$$R=\rho L/(Wt)=R_{sheet} \qquad \text{Equation 1}$$

At this time, if width of the polysilicon layer due to overetch or underetch of the an n+ polysilicon layer is varied, resistance thereof is varied as the following Equation 2.

$$R'=R_{sheet} \qquad \text{Equation 2}$$

That is, overetch rate or underetch rate is identified by comparing the measured resistance (R') with the reference resistance (R). Sheet resistance $R_{sheet}$ of the n+ polysilicon layer, which is the reference resistance, uses resistance obtained by a greek cross test pattern.

Figure 5:
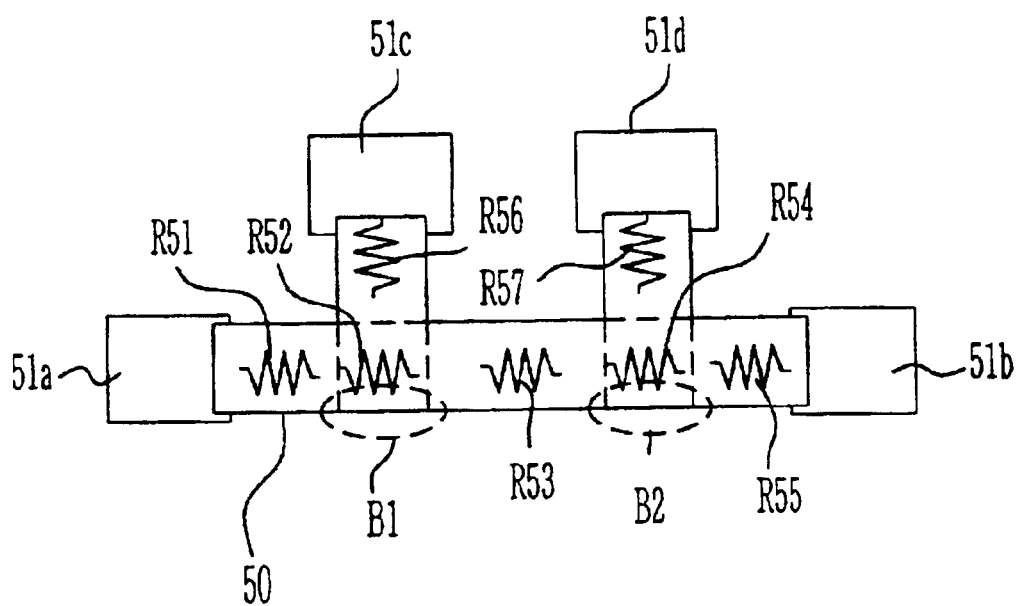
FIG. 5 is an equivalent circuit of a disclosed test pattern.

FIG. 5 is an equivalent circuit of the test pattern of the semiconductor device. A current is applied to a polysilicon layer 50 through first and second junction regions 51a and 51b and voltage between third and fourth junction regions 51c and 51d is then measured. Sum of second to fourth resistive components R52 to R54 among first to fourth resistive components R51 to R54 is obtained by using the current and the measured voltage. Since the third and fourth junction region 51c and 51d are positioned near to the polysilicon layer 50, sixth and seventh resistive component R56 and R57 is smaller than the first to fifth resistive component R51 to R55 as disregard.

However, an overetch is occurred at an opposite side walls B1 and B2 of a portion where the polysilicon layer 50 meets with the second and third junction regions 51b and 51c so that the sheet resistance $R_{sheet}$ is not applied to the second and fourth resistive components R52 and R54. Therefore, if the sheet resistance of the polysilicon is applied as a reference, an error may be occurred in measurement of the etching profile.

Figure 6:
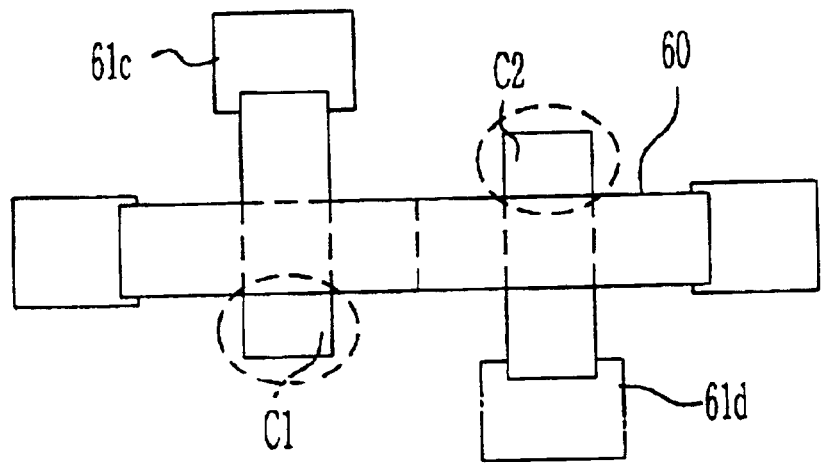
FIG. 6 is a schematic illustration of a disclosed method forming a test pattern.

FIG. 6 is a lay out for explaining an embodiment of a test pattern by which the problem of FIG. 5 can be overcome. Projection portions C1 and C2 are formed on opposite side walls of the first and third regions on which a projection portion is formed, to electrically connect the polysilicon layer 60 to the third and fourth junction regions 61c and 61d in a basic structure of the test pattern shown in FIG. 5.

The first and second regions is not affected by an etching process due to the projection regions formed on side walls thereof. Therefore, the sheet resistance can be applied to the polysilicon layer of the first and second regions as it is so that it is possible to accurately measure an etching profile of the polysilicon layer 50.

Figure 7:
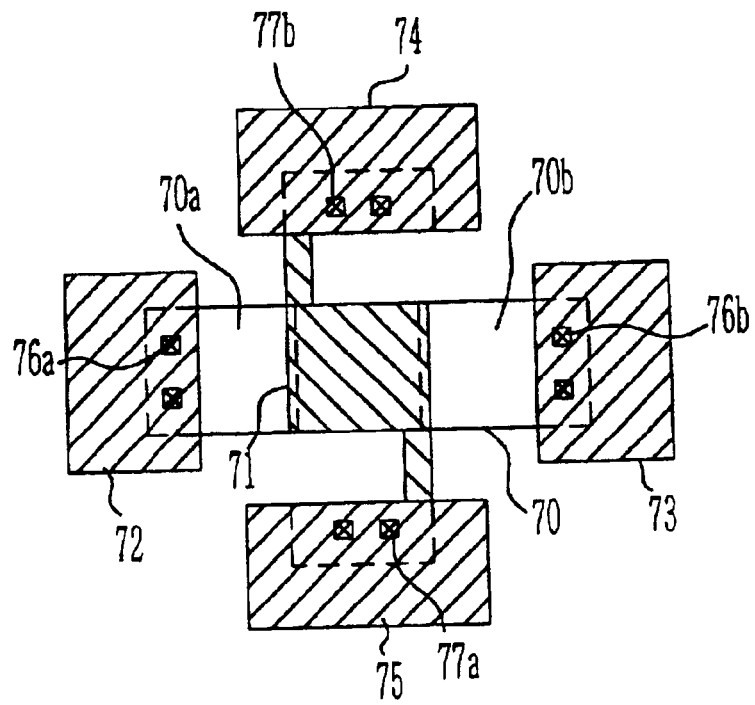
FIG. 7 is a schematic illustration of another disclosed method of forming a test pattern according.

FIG. 7 is a lay out for explaining a method of forming a test pattern according to another disclosed embodiment. An active region 70 is defined by forming an isolation region (not shown) on a selected portion of the semiconductor substrate. For example, the active region is defined in form of a rectangle.

A conductive pattern 71 is formed on the semiconductor substrate to vertically cross with the active region. At this time, the conductive pattern 71 in portions where the active region 70 is not overlapped are asymmetrically formed in center of the active region 70 and has a "¬" or "L" shape projection, wherein width thereof is narrow than a portion where the active region is overlapped. As shown in FIG. 7, the conductive pattern 71 is vertically crossed with the active region 70, of which portions not being overlapped with the active region 70 and having a or "¬" or "L" shape are asymmetrically formed in center of the active region 70.

An impurity ion is implanted to the exposed active region 70 and a thermal treatment is then performed so that first and second impurity region 70a and 70b are formed. Both side portions of the conductive pattern 71 are overlapped with portions of the first and second impurity regions 70a and 70b to electrically connect thereto by diffusing impurity under the conductive pattern 71 during the thermal treatment.

An inter insulating layer (not shown) is formed on the entire structure. The inter insulating layer is patterned to expose both side portions of the first and second impurity regions 70a and 70b, thereby forming contact portions 76a, 76b, 77a and 77b as shown in FIG. 7.

A conductive layer is formed on the inter insulating layer. The conductive layer is patterned to form first and second current supply lines connected to the first and second impurity region 70a and 70b through the contact portions 76a and 76b, and to form first and second voltage measuring lines 74 and 75 connected to the test pattern 71 through the contact portions 77a and 77b.

In the meantime, before the formation of the test pattern 71, a gate oxide layer (not shown) is formed on the semiconductor substrate to isolate between the first and second impurity regions 70a and 70b, and the test pattern 71. As a result, it is possible to form a gate electrode having the test pattern and a transistor having a source and a drain which are formed by the first and second impurity regions 70a and 70b.

A method of measuring overetch or underetch of the conductive layer 71, which is occurred during an etching process to form the conductive layer 71, using the above mentioned pattern will be explained.

The first and second impurity regions 70a and 70b are electrically connected from each other through the conductive layer 71. If a constant current flows through the first impurity region 70a, the conductive layer 71 and the second impurity region 70 via the first and second current supply lines 72 and 73, voltage applied to the conductive layer 71, which is overlapped with the active region 70, can be measured through the first and second voltage measuring lines 74 and 75 which are connected to the contact portions 77a and 77b, respectively.

Resistance of the conductive layer 71 is calculated by the amount of current and the measured voltage. As a result, etching rate of the conductive layer 71 can be measured by the method mentioned in FIG. 4.

Using the above mentioned test pattern, it is possible to measure electric characteristic of a transistor. To realize such a measurement, a gate oxide layer (not shown) is formed on the active region before the formation of the conductive layer 71 as shown in FIG. 7.

Below, a method of measuring the electric characteristic of the transistor will be explained using the above mentioned pattern.

In the above process, a gate oxide layer is formed before the formation of the conductive layer 71. The subsequent processes are same as the above process except for the formation of the gate oxide layer.

The conductive layer 71 is electrically isolated from the first and second junction regions 70a and 70b by the gate oxide layer. The conductive layer 71 becomes a gate electrode and the first and second junction regions 70a and 70b become a source and a drain, respectively, thereby forming a transistor.

If voltage is applied to the conductive layer 71, which is the gate electrode, using the first voltage measuring line 74 or the second voltage measuring line 75, a channel is formed in the active region under the conductive layer 71. One of the first and second impurity regions 70a and 70b that act as the source and the drain is connected to a ground through one of the first and second current supply lines 72 and 73. The remaining one of the first and second impurity regions 70a and 70b is applied with a voltage through the remaining one of the first and second current supply lines 72 and 73 so that a current flows through them.

The channel formed under the conductive layer 71 is proportional to an area of the conductive layer 71. Amount of the current is depended on the channel area. That is, the current flowing through the active region is proportional to area of the conductive layer 71. Change of current amount is calculated by comparing the measured current with a reference data, thereby identifying rate of overetch or underetch of the conductive layer 71.

This means that principal of identifying etching rate using the test pattern can be applied to a conventional MOSFET pattern, as it is. That is, such a pattern has merit that a device having a gate insulating layer and a device having no a gate insulating layer can be formed on same wafer and electrical characteristic of the MOSFET can be measured by etching rate of the test pattern.

Figure 8:
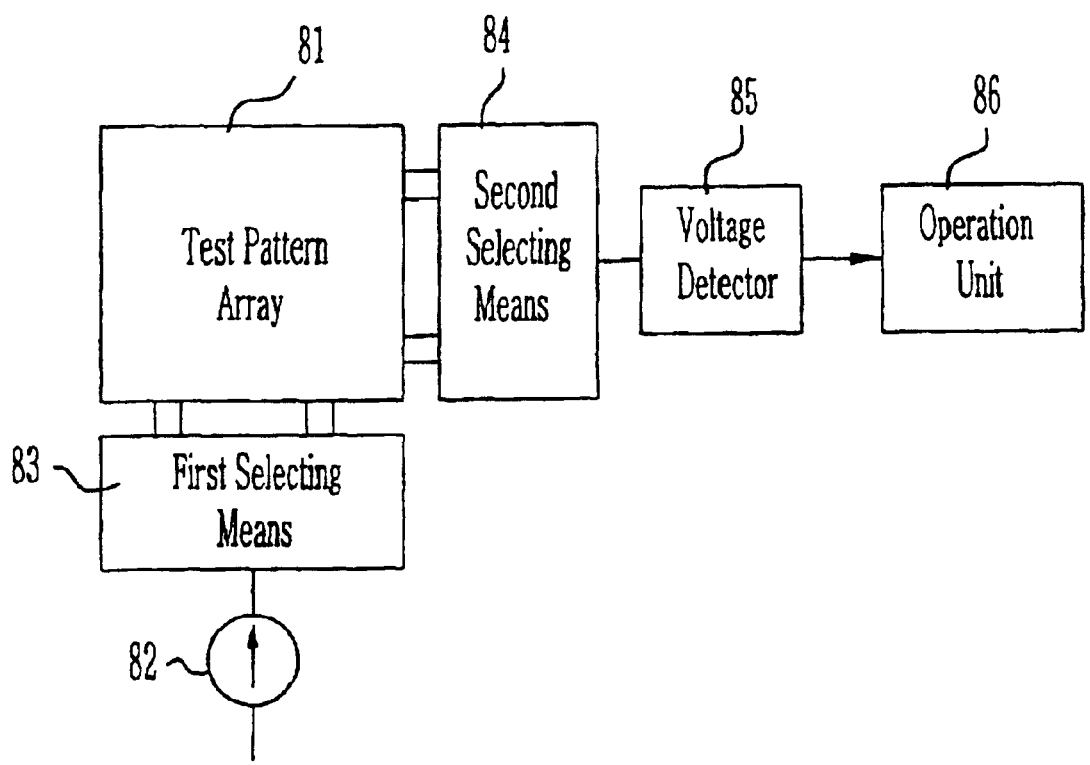
FIG. 8 is a block diagram for measuring an etching characteristic in the entire region of a wafer.

FIG. 8 is a block diagram of an etching characteristic measuring circuit by which an etching characteristic in the entire region of a wafer can be measured by using the above pattern. An etching characteristic measuring circuit includes a test pattern array 81 having a plurality of patterns which are formed on the entire region of a wafer, respectively, a current supply means 82 to supply a current, a first selecting means 83 for selecting a test pattern to supply a current among a plurality of patterns included in the test pattern array 81, a second selecting means 84 for selecting a test pattern to measure voltage among a plurality of patterns, a voltage detector 85 to detect a voltage of voltage of the test pattern selected by the second selecting means 84, and an operation unit to calculate an etching rate of the test pattern by calculate resistance by using voltage difference and amount of current and by calculate a cross sectional area by comparing a sheet resistance to the test pattern.

The operation unit 86 includes an A/D converter (not shown) to convert an output signal from the voltage detector to a digital signal and a register (not shown) to store the digital signal.

The test pattern is the same as the test pattern of FIG. 6. The first and second selecting means includes a multiplexer. The voltage detector 85, an A/D converter 86 and a register are configured by a conventional circuit.

The test pattern array having a plurality of patterns will be explained as follows.

Figure 9A:
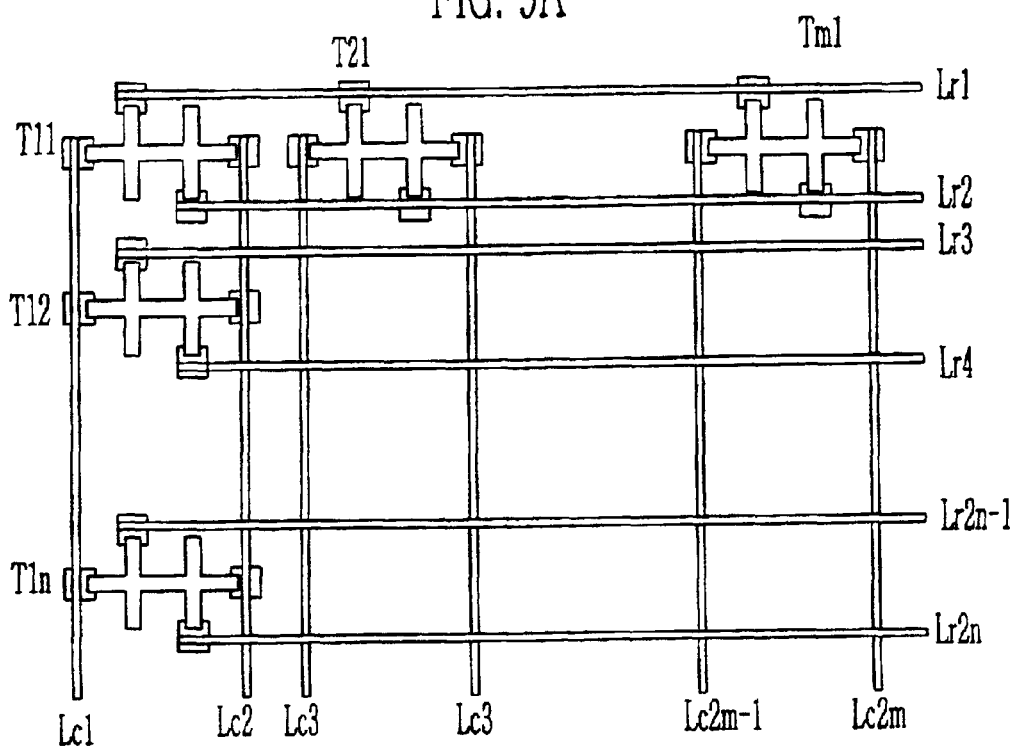
FIGS. 9a and 9b are schematic views of the test pattern shown in FIG. 8.
Figure 9B:
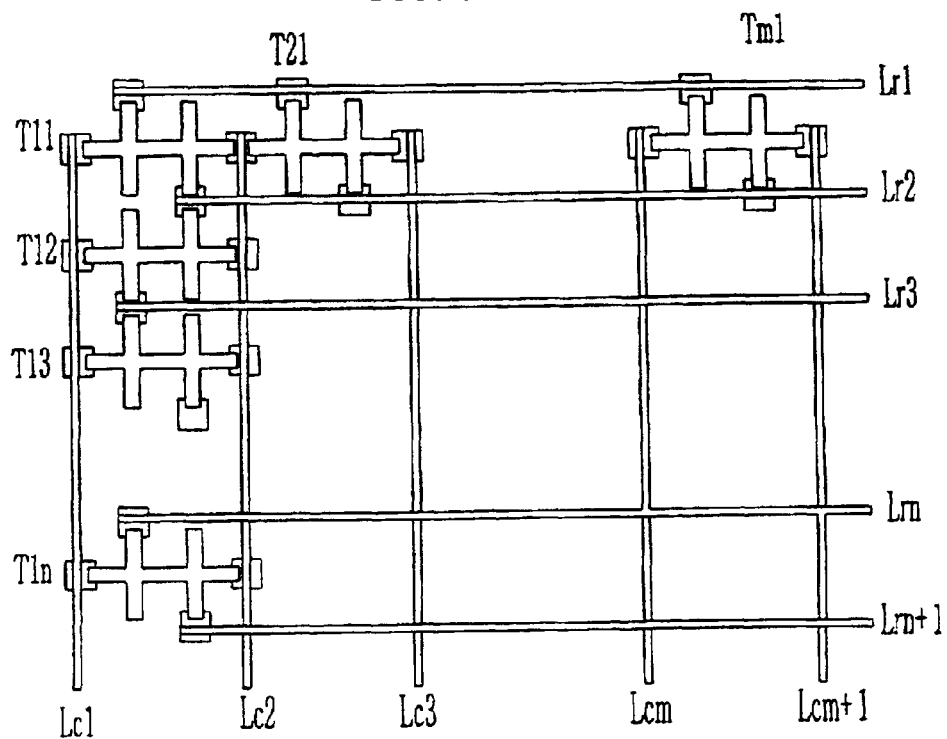

FIGS. 9a and 9b are lay-out for explaining first and second embodiments of a method of forming the test pattern array of FIG. 8

A first embodiment will be explained with reference to FIG. 9a. A plurality of test patterns T11 to Tm1 are formed in one column and such patterns are formed in a plurality of rows. That is, m×n patterns T11 to Tmn are formed in a plurality of rows and columns, in which the test patterns formed on the entire structure of a wafer.

As explained in FIG. 6, the respective test pattern is formed in a straight type pattern as a basic pattern. The straight pattern has first and second regions, in which first and second projection regions are formed on both side portions of the first region and third and fourth projection regions are formed on both side portions of the second region. That is, the test pattern has a straight type pattern and the first to fourth projection portions.

Metal lines for current lines are connected to both ends of the straight type pattern. A current flows through the straight type pattern by supplying and extracting a current through these current lines. Since the straight pattern has resistance, voltage drop is occurred if current flows through it. The voltage drop differently appears in each region of the straight type pattern. Metal lines for measuring a voltage are connected to the first projection portion of the first region and the fourth projection portion of the second region, respectively. Using the voltage measuring lines, voltage between the first and second region is measured. The second and third projection portions are formed to prevent etching of side walls of the first and second regions during an etching process for forming the test pattern. Accordingly, voltage between the first and second regions can be more accurately measured.

The test pattern array will be explained in more detail. In the test pattern T11 to T1n of the first column, the first and second current lines Lc1 and Lc2 to supply and extract a current are commonly connected to both ends of each test pattern. In the test pattern T21 to T2n of the second column, the first and third and fourth current lines Lc3 and Lc4 to supply and extract a current are commonly connected to both ends of each test pattern. In the same manner, in the test patterns of the third to m-th columns, current lines to supply and extract a current are commonly connected every column.

In the test pattern T11 to Tm1 of the first row, the first and second voltage measuring lines Lr1 and Lr2 to measure voltage between the first and second regions are commonly connected to the first and fourth projection portions of each test pattern T11 to Tm1. In the test pattern T12 to Tm2 of the second row, the third and fourth voltage measuring lines Lr3 and Lr4 are commonly connected to the third and fourth projection portions of each test pattern T12 to Tm2. In the same manner, in the test patterns of the third to m-th rows, voltage measuring lines to measure voltage are commonly connected every row An etching characteristic measuring circuit including the test pattern array will be explained with reference to FIG. 8 and FIG. 9a.

The first and second current lines Lc1 and Lc2 are selected by the first selecting means 83. If current is applied to the first and second current lines Lc1 and Lc2 by the current supply means 82, current flows through whole test patterns T11 to T1n of the first column both ends of which are commonly connected to the first and second current lines Lc1 and Lc2.

The first and second voltage measuring lines Lr1 and Lr2 are selected by the second selecting means 84 so that whole test patterns T11 to Tm1 of the first row commonly connected to the projection portion of the first and second voltage measuring lines Lr1 and Lr2 are selected. Current only flows through a first pattern T11 and do not flows through the remaining test patterns T21 to Tm1. Voltage dropped by the first test pattern T11 is measured by the voltage detector 85 in the first row. Voltage dropped by the first test pattern T11 in the first column is voltage corresponding to voltage difference generated between the first and second regions. The voltage difference measured by the voltage detector 85 is transferred to the operation unit 86 and converted to a digital signal by the A/D converter included in the operational unit 86 and stored on the register. The operational unit calculates resistance by the digital signal stored on the register and the supplying current. The etching rate of the test pattern is obtained by calculating a sectional area by comparing the calculated resistance with the sheet resistance of the test pattern.

Through the above method, a test pattern for measuring an etching characteristic among a plurality of test patterns formed on the entire region of a wafer is selected by the first and second selecting means and a current is supplied to the selected test pattern through the current lines. Voltage between the first and second region of the selected test pattern is measured through the voltage measuring lines. Thereafter, resistance between the first and second region id measured by using the current supplied to the selected pattern and the measured voltage and a cross sectional area of the selected test pattern is measured by the measured resistance, thereby obtaining etching characteristic every regions of the wafer.

A second embodiment of a test pattern array will be explained with reference to FIG. 9b. A basic structure of the test pattern is identical to that of the first embodiment. That is, a plurality of test patterns T11 to Tm1 are formed in one row and such patterns are formed in a plurality of columns. That is, m×n patterns T11 to Tmn are formed in a plurality of rows and columns, in which the test patterns formed on the entire region of a wafer.

In the test pattern T11 to T1n of the first column, the first and second current lines Lc1 and Lc2 to supply and extract a current are commonly connected to both ends of each test pattern. In the test pattern T21 to T2n of the second column, the second and third current lines Lc2 and Lc3 to supply and extract a current are commonly connected to both ends of each test pattern. The second current line Lc2 is commonly connected to ends of the test patterns T11 to t1n in first column and the test patterns T21 to T2n in the second column. In the same manner, in the test patterns of the third to m-th rows, current lines to supply and extract a current are commonly connected every column.

It is a difference point between the first embodiment and the second embodiment to differently form current lines. In second embodiment, the test patterns T11 to T1n in the first column and the test patterns T21 to T2n in the second column are connected to the second current line Lc2. That is, the neighboring test patterns are commonly connected to one current line. Therefore, the number of current lines in the second embodiment is smaller than that of the first embodiment.

In the test pattern T11 to Tm1 of the first row, the first and second voltage measuring lines Lr1 and Lr2 to measure voltage between the first and second regions are commonly connected to the first and fourth projection portions of each test pattern T11 to Tm1. In the test pattern T12 to Tm2 of the second rows, the second and third voltage measuring lines Lr2 and Lr3 are commonly connected to the first and fourth projection portions of each test pattern T12 to Tm2. The second voltage measuring lines Lr2 is commonly connected to the fourth projection portions of the test patterns T11 to Tm1 in the first row and the first projection portion of the test patterns T12 to Tm2 in the second row. In the same manner, in the test patterns of the third to m-th rows, voltage measuring lines to measure voltage are commonly connected every rows.

It is a difference point between the first embodiment and the second embodiment to differently form the voltage measuring lines. In second embodiment, the test patterns T11 to Tm1 in the first row and the test patterns T12 to Tm2 in the second row are connected to the second voltage measuring line Lr2. That is, the neighboring test patterns are commonly connected to one voltage measuring line. Therefore, the number of voltage measuring lines in the second embodiment is smaller than that of the first embodiment.

An etching characteristic measuring circuit including the test pattern array will be explained with reference to FIG. 8 and FIG. 9b. The first and second current lines Lc1 and Lc2 are selected by the first selecting means 83. If current is applied to the first and second current lines Lc1 and Lc2 by the current supply means 82, current flows through whole test patterns T11 to T1n of the first column both ends of which are commonly connected to the first and second current lines Lc1 and Lc2. At this time, the second current line Lc2 is connected to end of the test patterns T21 to T2n in the 2ecind column but the third current line Lc3 connected to other end is not selected. Therefore, current is not flow through the test patterns T21 to T2n.

The first and second voltage measuring lines Lr1 and Lr2 are selected by the second selecting means 84 so that whole test patterns T11 to Tm1 of the first row commonly connected to the projection portion of the first and second voltage measuring lines Lr1 and Lr2 are selected.

The second voltage measuring line Lr2 is connected to a first projection region of the test patterns T12 to Tm2 in the second row but the third voltage measuring line Lr3 is not selected. Accordingly, voltage drop is not occurred in the second test patterns T12 to Tm2. Also, current only flows through a first pattern T11 and do not flows through the remaining test patterns T21 to Tm1. Voltage dropped by the first test pattern T11 is measured by the voltage detector 85 in the first row. Voltage dropped by the first test pattern T11 in the first row is voltage corresponding to voltage difference generated between the first and second regions. The voltage difference measured by the voltage detector 85 is transferred to the operation unit 86 and converted to a digital signal by the A/D converter included in the operational unit 86 and stored on the register. The operational unit calculates resistance by the digital signal stored on the register and the supplying current. The etching rate of the test pattern is obtained by calculating a sectional area by comparing the calculated resistance with the sheet resistance of the test pattern.

In the same manner as the first embodiment, the second embodiment is summarized as follows. A test pattern for measuring an etching characteristic among a plurality of test patterns formed on the entire region of a wafer is selected by the first and second selecting means and a current is supplied to the selected test pattern through the current lines. Voltage between the first and second region of the selected test pattern is measured through the voltage measuring lines. Thereafter, resistance between the first and second region id measured by using the current supplied to the selected pattern and the measured voltage and a cross sectional area of the selected test pattern is measured by the measured resistance, thereby obtaining etching characteristic every regions of the wafer.

As described above, an etching profile of the polysilicon gate is measured by using the resistance of the polysilicon layer. The etching profile can be nondestructively and electrically measured with using the conventional MOSFET pattern as it is. Therefore, gate influence to fluctuation of transistor characteristic is quantitatively analyzed, thereby increasing yield.

The present invention has been described with reference to a particular embodiment in connection with a particular application. Those having ordinary skill in the art and access to the teachings of the present invention will recognize additional modifications and applications within the scope thereof. It is therefore intended by the appended claims to cover any and all such applications, modifications, and embodiments within the scope of the present invention.

What is claimed is:

1. Method of forming a test pattern comprising:
    forming first and second junction regions having a symmetrical structure on both sides of field oxide layer formed on a semiconductor substrate;
    forming third and fourth junction regions having a asymmetrical structure on front and rear portions of said field oxide layer;
    forming a test pattern having first and second projection portions on said semiconductor substrate, in which both side portions of said test pattern are overlapped with said first and second junction regions and said first and second projection portions which are formed on front and rear portions of said test pattern are overlapped with said third and fourth junction regions;
    forming an inter insulating layer on a resulting structure after forming said test pattern;
    patterning said inter insulating layer to expose a portion of said first to fourth junction regions;
    forming current supply lines connected to said first and second junction regions, respectively; and
    forming voltage measuring lines connected to said third and fourth junction regions, respectively.

2. The method of claim 1, wherein said test pattern comprises a stack structure having a polysilicon layer, an insulating layer and a metal layer.

3. The method of claim 2, wherein said polysilicon layer is formed by a process of forming a polysilicon layer for a gate of a transistor which is formed on a peripheral region of said semiconductor substrate.

4. Method of measuring etching characteristic using a test pattern comprising:
    providing a test pattern formed by the method of the claim 1;

supplying a current through said current supply lines;

measuring voltage between said first and second region through said voltage measuring lines connected to said third and fourth junction regions; and calculating a cross sectional area by resistance obtained by using said current and the measured voltage so that the etching characteristic of said test pattern is measured.

5. A Circuit for measuring an etching characteristic using a test pattern, the circuit comprising:

a test pattern array having a plurality of test patterns formed by the method of claim 1, a plurality of current supply lines disposed in rows and a plurality of voltage measuring lines disposed in columns;

a first selecting means for selecting the voltage measuring lines;

a second selecting means for selecting the current supply lines;

current supply means for supplying a current to one of said current supply lines connected to one of said plurality of test patterns selected by said first and second selecting means;

voltage detector for detecting voltage from one of said voltage measuring lines connected to the selected pattern; and operation unit for calculating a cross sectional area by comparing a sheet resistance of said test pattern with resistance obtained by using said current and the measured voltage so that the etching characteristic of said test pattern is measured.

6. The method of claim 5, wherein said operation unit comprises an A/D converter for converting an output signal from said voltage detector to a digital signal and a register for storing said digital signal.

7. The method of claim 5, wherein said test patterns of said test pattern array are disposed in rows and columns, in which both ends of each test pattern in each column is connected to current supply lines, respectively, with said current supply lines being selected by said first selecting means.

8. The method of claim 7, wherein projection portions of each test pattern in each row is connected to voltage measuring lines, respectively, in which said voltage measuring lines are selected by said second selecting means.

9. The method of claim 5, wherein said test patterns of said test pattern array are disposed in rows and columns, in which one end of neighboring two test patterns in the same column is connected from each other and the remains end of said two neighboring test patterns are connected to said current supply lines, respectively, with said current supply lines being selected by said first selecting means.

10. The method of claim 9, wherein one projection portion of said neighboring two test patterns in the same row is connected from each other and the remains projection portion of said two neighboring test patterns are connected to said voltage measuring lines, respectively, with said current supply lines being selected by said second selecting means.

* * * * *